US006632698B2

United States Patent
Ives

(10) Patent No.: US 6,632,698 B2
(45) Date of Patent: Oct. 14, 2003

(54) MICROELECTROMECHANICAL DEVICE HAVING A STIFFENED SUPPORT BEAM, AND METHODS OF FORMING STIFFENED SUPPORT BEAMS IN MEMS

(75) Inventor: Thomas W. Ives, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 144 days.

(21) Appl. No.: 09/924,370

(22) Filed: Aug. 7, 2001

(65) Prior Publication Data

US 2003/0032215 A1 Feb. 13, 2003

(51) Int. Cl.[7] .......................... H01L 21/00; H01L 29/82
(52) U.S. Cl. ......................... 438/52; 438/50; 257/415; 257/417; 257/420
(58) Field of Search ................................. 257/419, 417, 257/415, 420; 438/50, 52, 53

(56) References Cited

U.S. PATENT DOCUMENTS

| | | | | |
|---|---|---|---|---|
| 6,000,280 A | * | 12/1999 | Miller et al. | 73/105 |
| 6,010,919 A | * | 1/2000 | Matsuhiro et al. | 438/52 |
| 6,073,484 A | * | 6/2000 | Miller et al. | 73/105 |
| 6,093,330 A | * | 7/2000 | Chong et al. | 216/2 |
| 6,117,701 A | * | 9/2000 | Buchan et al. | 438/52 |
| 6,308,631 B1 | * | 10/2001 | Smith et al. | 102/254 |
| 6,388,789 B1 | * | 5/2002 | Bernstein | 359/198 |
| 6,445,106 B1 | * | 9/2002 | Ma et al. | 310/309 |
| 6,462,391 B1 | * | 10/2002 | Chong et al. | 257/419 |

* cited by examiner

*Primary Examiner*—Matthew Smith
*Assistant Examiner*—Lex H. Malsawma

(57) ABSTRACT

A microelectromechanical device (MEMD) defined within a substrate of a MEMS includes a mass element defining an area of interest. The device also includes a support beam supporting the mass element in spaced-apart relationship from the substrate. The support beam includes a first beam member defined by a first fixed end connected to the substrate, and a first free end connected to the mass element. The support beam further includes a second beam member defined by a second fixed end connected to the substrate, and a second free end connected to the mass element. The beam members are in spaced-apart relationship from one another. A first cross member connects the first beam member and the second beam member. Preferably, the support beam includes a plurality of cross members. Two such support beams can be used to support a mass element in a MEMD in a bridge configuration.

8 Claims, 10 Drawing Sheets

MICROELECTROMECHANICAL DEVICE HAVING A STIFFENED SUPPORT BEAM, AND METHODS OF FORMING STIFFENED SUPPORT BEAMS IN MEMS

FIELD OF THE INVENTION

The invention claimed and disclosed herein pertains to Micro Electro Mechanical Systems ("MEMS", MicroElectroMechanicalSystems or micro-electro-mechanical systems), and in particular to MEMS having stiffened beams (sometimes called flexures), and methods for stiffening beams in MEMS.

BACKGROUND OF THE INVENTION

The present invention is directed towards structures which are used to support suspended masses in MicroElectroMechanicalSystems ("MEMS"). MEMS, as the name suggests, are microelectromechanical systems that provide mechanical components and electrical components (collectively, microelectromechanical components, which make up microelectromechanical devices, or "MEMDs") to produce a micromachine capable of controlling, or responding to, an environmental condition within the system. The mechanical components and electrical components in MEMS are typically dimensionally measured in microns ($1 \times 10^{-6}$ meters). MEMS devices typically include microsensors to detect changes in the system's environment, an intelligent component (such as a control logic circuit) which makes decisions based on changes detected by the microsensors, and microactuators which the system uses to change its environment. Example MEMS devices include inkjet-printer cartridges, accelerometers that deploy airbags in automobiles, and inertial guidance systems. MEMS are typically fabricated from, or are fabricate on, a substrate, and are fabricated using known (as well as newly developed) technologies. One of the primary technologies used in the fabrication of MEMS are depositional and mask technologies which are applied to fabricate the MEMS much in the same manner that semiconductor devices such as microprocessors and memory devices are fabricated. MEMS fabrication techniques also include photoetching and/or micromachining to remove part of one or more of deposited layers to thus define one or more of the mechanical or electrical devices. Micromachining often is performed using a focused ion beam such as an eximer laser for small adjustments to prototypes.

Certain micromechanical and microelectromechanical devices ("MEMDs") comprise masses or mass elements which define surfaces which are supported by a beam or a bridge. The beam or bridge acts as a flexible member allowing the mass element to move with respect to surrounding structures in the MEMS. Typically the mass element is supported by the beam or bridge such that it is free of contact with the surrounding elements of the MEMD. The mass element can be part of a microactuator or a microsensor, as well as a component in other types of MEMDs. For example, a microactuator can be configured to drive a resonant sensor to cause the sensor to oscillate at its resonant frequency. In other applications microactuators can be used to produce a mechanical output required for a particular microsystem. An example of this latter application is using a microactuator to move micromirrors to scan laser beams (as for example in laser printing). Accordingly, the mass element which is supported in a MEMS by a bridge or beam defines an "area of interest" which can support microsensor components or other components which comprise parts of a microactuator. Alternately, the mass element itself can have electrical properties, such as conductance, capacitance or resistance, and the mass element can thus itself be used as the active component in the MEMD.

In general, it is desirable that the beam or bridge used to support a mass element in a MEMS have sufficient structural strength that it can support the mass element above another surface, or between two other surfaces. Turning to FIG. 1, a plan view of a section of a MEMS 10 is depicted in a simplified sectional plan view. The section of the MEMS depicts a component of a microelectromechanical device 11, which comprises a mass element 12 supported by a cantilevered beam section 20. The MEMD component 11 is defined from the surrounding substrate 16. This can be accomplished using photolithographic processes, for example, wherein the zone 18 between the device 11 and the rest of the substrate 16 is removed by etching or micromachining. The mass element 12 defines an area of interest 14. FIG. 1 (and the other figures discussed below) is not to scale, but is depicted so as to facilitate understanding of the prior art. The prior art beam section 20 is a solid beam from its first end 21 where it is connected to the substrate 16, to the point of attachment 23 to the mass element 12. The beam section of these MEMD components must be sufficiently rigid such that movement of the mass element 12 does not occur in a direction indicated by the arrow "X", but rather occurs in a direction into and out of the plane of the sheet on which the figure is drawn. (A brief review of FIG. 3, which depicts a similar prior art device, shows that the mass element 12 is intended to move in the directions indicated by the arrow "Y"). If the beam section 20 (FIG. 1) is insufficiently stiff to resist bending on the beam in the "X" direction (FIG. 3), then the mass element 12 can come into contact with the inner wall 28 (FIG. 1) of the substrate 16. This can cause improper sensor readings, failure to actuate another device, or complete failure of the device 11 should the mass element 12 become stuck due to friction between the mass element 12 and the sidewall 28. One method to provide sufficient rigidity in the "X" direction is to make the beam quite wide (i.e., a relatively large dimension in the "X" direction).

However, the beam section 20 must be sufficiently flexible to allow the mass element 12 to oscillate relatively freely into and out of the plane ("Y" of FIG. 3). However, these two objectives—allowing flexibility in the "Y" direction while providing rigidity in the "X" direction—are at cross-purposes. One problem with increasing the width of the beam section 20 to provide rigidity in the "X" direction is that it increases the mass of the beam, thus requiring more power to cause the mass element 12 to move. Further, providing a massive beam requires that complex calculations be performed to calibrate a microsensor or a microactuator in which the device 11 is a component. If the mass of the beam 20 were sufficiently small, then it's mass could potentially be ignored when making these calculations, greatly simplifying the design task.

One prior art solution to this problem is depicted in FIG. 2. FIG. 2 depicts a partial plan view of a slightly modified micromechanical device 11' in a MEMS 10'. The device 11' is in most respects same as the device 11 depicted in FIG. 1. Like-numbered components between the devices 11 and 11' of respective FIGS. 1 and 2 are essentially the same. However, the micromechanical device 11' of FIG. 2 has a modified beam section 20'. The beam section 20' comprises a first beam member 24, and a second essentially parallel beam member 26, thereby defining an opening 22 between the two beam members. Each beam member is defined by a thickness "T". The micromechanical device 11' is further depicted in a side elevation sectional view in FIG. 4. FIG. 4 is provided to facilitate understanding of how the device 11' can operate, and depicts an example wherein the device 11' is a microsensor. The mass element 12 of the device 11' supports a material (such as an electromagnetic material) 32 and 34 on the respective upper and lower surfaces of the mass element 12. Semiconductor material 36 and 38 is formed into the surrounding substrate 16 proximate to the respective upper and lower surface of the device mass element 12. As the mass element 12 is oscillated in the "Y" direction, an electrical property (such as electrical current or voltage) can be induced or varied between the semiconductor surfaces 36 and 38. This variance can be detected and measured. As an environmental condition (such as temperature) affects the device 11', the rate of oscillation of the mass element 12 will be varied, which can be detected by the semiconductors 32 and 34 since the measured electrical property will change as a result of the change in the rate of oscillation of the mass element 12. Turning to FIG. 3, an isometric sectional view of the prior art MEMS 10' of FIG. 2 is depicted. As can be seen, each beam member 24 and 26 of the beam section 20' is further defined by a height "H".

The prior art design depicted in FIGS. 2–4 reduces the mass of the beam section 20' over that of the prior art beam 20 depicted in FIG. 1, and also provides more flexibility in the "Y" direction for the mass element 12 (see FIG. 3). However, in order to prevent movement of the mass element 12 in the "X" direction, the beam members 24 and 26 must be relatively thick ("T" of FIG. 2). Also, the design depicted in FIGS. 2 and 3 reduces the resistance to torsional bending over the design depicted in FIG. 1 so that it becomes easier for the mass element 12 to rotate in the direction indicated by the arrow "T" about axis "Z". Such torsional bending can lead to erroneous results from the micromechanical device 11', and can also lead to the mass element 12 becoming wedged against the inner wall 28 of the substrate 16 (see FIG. 1). Torsional bending can be reduced by increasing the thickness "T" (FIG. 2) of the beam members, or by increasing their height "H" (FIG. 3), but both of these solutions work against the goals of reducing mass of the beam and increasing the flexibility of the beam in the "Y" direction.

A second type of micromechanical device is depicted in FIGS. 5A and 5B. FIG. 5A depicts a side elevation sectional view of a microactuator 40 which is defined in a surrounding substrate 48. The device 40 is known as a comb drive and comprises a mass element 42 which is supported in the substrate 16 by two bridge members 41 and 43. The mass element 42 supports an upper series of fingers 45, and a lower series of fingers 44. Fingers 44 and 45 are interdigitated with respective static fingers 47 and 46, which are supported by the substrate 48. The bridge members 41 and 43 are designed to be flexible to allow the mass element 42, and thus the supported series of fingers 44 and 45, to move in a direction "A" as depicted in FIG. 5B when a voltage is applied between fingers 46 and the mass element 42. Likewise, when a voltage is applied between the mass element 42 and fingers 47, the mass element will move in the opposite direction. The movement of the mass element 42 in response to an applied voltage is proportional to the number of fingers as well as the bending resistance of the beam members 41 and 43. Since it is generally desirable to use as little power as possible to actuate micromechanical devices, the device 40 can be made more responsive by either increasing the number of fingers, or by lowering the mass of the bridge members 41 and 43. However, increasing the number of fingers requires additional fabrication, such as micromachining, which adds cost to the device and increases the chance that a device will need to be rejected due to a fabrication error. Further, as more fingers are added, the more likely it becomes that the fingers will not be properly interdigitated and the device will not operate correctly (or at all). The second solution, decreasing the mass of the bridge members, can leave the bridge members with insufficient resistance to torsional bending, or allow them to deform unevenly, both of which can cause fingers 44 and 45 which are supported on the mass element 42 to bind with the static fingers 46 and 47. This can cause the device 40 to malfunction or to even be irreparably damaged.

What is needed then is a beam for supporting a mass element within a MEMS which achieves the benefits to be derived from similar prior art devices, but which avoids the shortcomings and detriments individually associated therewith.

SUMMARY OF THE INVENTION

The present invention provides for a microelectromechanical device, which includes a mass element, which is supported by one or more support beams. The support beam(s) comprise a first beam member and a second beam member, which in combination support the mass element free from a surrounding substrate. The beam members are connected to at least one, and preferably a plurality, of cross members, which connect the beam members into a resulting support beam. The resulting support beam is of relatively low mass and also provides for relatively high flexibility of the mass element in the intended direction of travel. The resulting support beam is also relatively stiff in a direction perpendicular to the intended direction or travel, and also provides for relatively high resistance to torsional deformation of the support beam. The mass element can be supported in a cantilevered manner by a single support beam in accordance with the present invention, or it can be supported by two support beams of the present invention in a bridge configuration.

In one embodiment the present invention provides for a microelectromechanical device defined within a substrate of a MEMS. The microelectromechanical device ("MEMD") can be for example a microsensor or a microactuator. The MEMD includes a mass element defining an area of interest. The area of interest can support additional components used to give the microelectromechanical device its functionality. The device also includes a support beam supporting the mass element in spaced-apart relationship from the substrate. The support beam comprises a first beam member defined by a first fixed end connected to the substrate, and a first free end connected to the mass element. The support beam further comprises a second beam member defined by a second fixed end connected to the substrate, and a second free end connected to the mass element, the second beam member being spaced apart from the first beam member. Finally, the support beam includes a first cross member connecting the first beam member and the second beam member.

Preferably the first beam member, the second beam member, the first cross member and the mass element define a first void, while the first beam member, the second beam member, the first cross member and the substrate define a second void. That is, the cross member bifurcates a void which is formed by the two beam members, the mass element and the substrate. In one configuration the beam members are substantially parallel, and the first cross member is substantially perpendicular to the beam members. In another configuration the first cross member is positioned at an angle to the beam members. The first cross member can be connected to the beam members across their entire height, or across only a portion of the height of the beam members. In a preferred embodiment the microelectromechanical device further comprises a second cross member connecting the first beam member and the second beam member, and the second cross member is in spaced-apart relationship from the first cross member. More preferably, the microelectromechanical device comprises a plurality of cross members connecting the beam members, and each of the cross members are in spaced-apart relationship from one another. In one variation wherein a plurality of cross members are used one of the cross members intersects another of the first members. In yet another variation, rather than the cross member connecting the beam members across the entire height of the beam members, the cross member connects the beam members at the upper edge (and/or the lower edge) of the beam members.

A second embodiment of the invention provides for a microelectromechanical device, which is a bridge structure, such that the mass element is supported between two support beams. More specifically, the microelectromechanical device is defined within a substrate of MEMS, and the MEMD comprises a mass element defining an area of interest. The mass element is defined by a first side and an opposite second side. The device includes a bridge supporting the mass element in spaced-apart relationship from the substrate. The bridge comprises a first support beam and a second support beam. Each support beam comprises a first beam member and a second beam member. The first and second beam members are defined by respective first and second fixed ends connected to the substrate. The first and second beam members are further defined by respective first and second free ends, which are connected to the mass element at the respective first and second edges thereof. The first and second beam members of each support beam are spaced apart from one another. Each support beam also includes a first cross member connecting the first and second beam members of each support beam.

Preferably, the microelectromechanical device having a bridge structure is configured such that each support beam further comprises a plurality of cross members connecting first and second beam members of each support beam. The cross members in each support beam can be in spaced apart relationship from one another, or they can intersect one another (or they can be a combination of spaced-apart and intersecting cross members).

A third embodiment of the present invention provides for a method of forming a microelectromechanical device, which has a mass element. The method includes the steps of depositing a substrate layer and then forming the mass element by removing at least a portion of the substrate layer. The resulting mass element defines an area of interest free of contact with the substrate. The substrate can include a plurality of different layers formed using known depositional technologies, and portions of the substrate can be removed also using known technologies, such as photolithography, wet etching, dry etching, and micromachining using a focused ion beam such as an excimer laser. The method further includes forming a first and a second beam member by removing at least a portion of the substrate. The beam members are spaced-apart from one another, and each resulting beam member is defined by a first fixed end connected to the substrate, and a first free end connected to the mass element. A cross member connecting the first beam member and the second beam member is formed by removing at least a portion of the substrate. The steps of forming the mass element, the beam members and the cross member can all be performed at the same time, as for example in an etching process.

As mentioned above, the substrate can be deposited as plurality of layers. At least one of the plurality of layers can comprise a sacrificial oxide, and at least one of the plurality of layers can comprise a polysilicon. The step of removing part of the substrate to form the mass element, the beam members and the cross member can be performed by etching away at least a part of the sacrificial oxide to leave the mass element, the beam members, and the cross member, all of which are formed from the polysilicon. In one variation the cross member can comprise a boron diffusion in the substrate. The substrate surrounding the boron diffusion can be removed for example by etching the substrate with potassium hydroxide (KOH).

These and other aspects and embodiments of the present invention will now be described in detail with reference to the accompanying drawings, wherein:

DETAILED DESCRIPTION OF THE INVENTION

Figure 1:
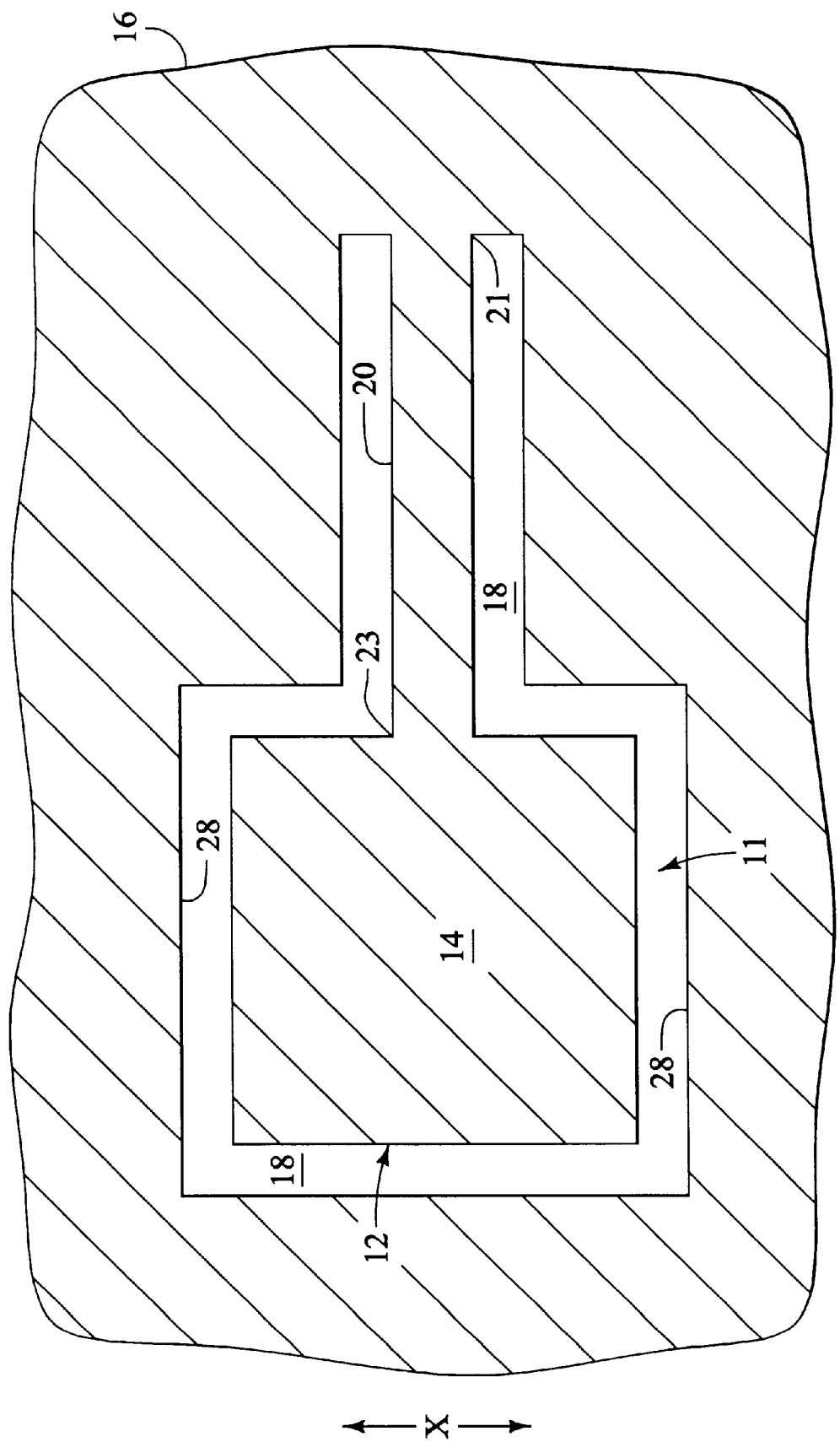
FIG. 1 depicts a sectional plan view of a MEMS device, showing one type of prior art cantilevered support beam.
Figure 2:
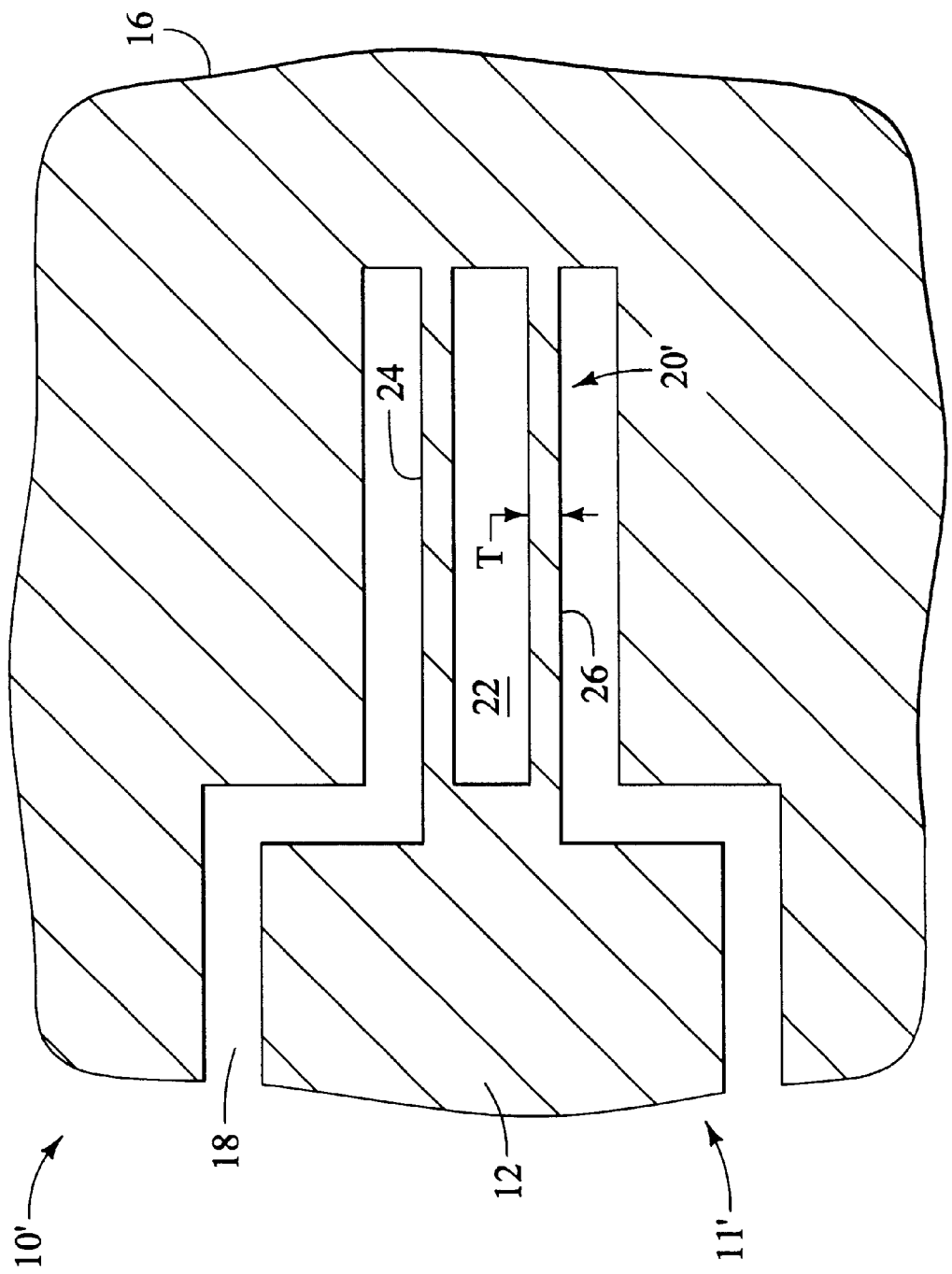
FIG. 2 depicts a sectional plan view of the MEMS device of FIG. 1 but showing another type of prior art cantilevered support beam.
Figure 3:
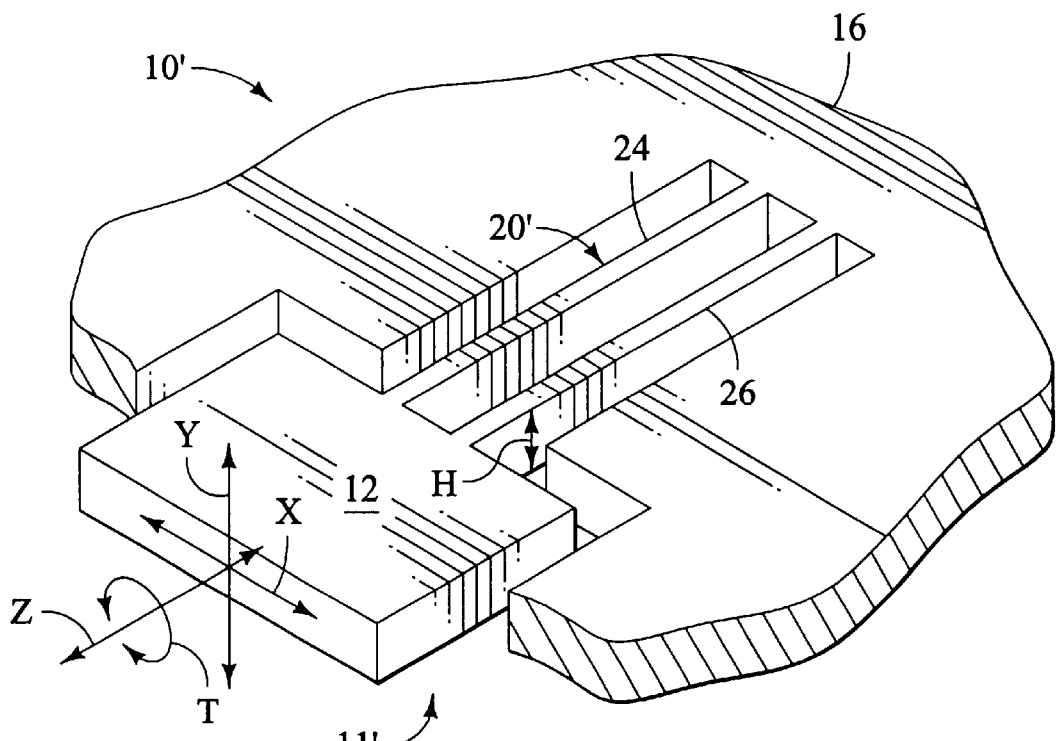
FIG. 3 depicts an isometric sectional view of the MEMS device of FIG. 2.
Figure 4:
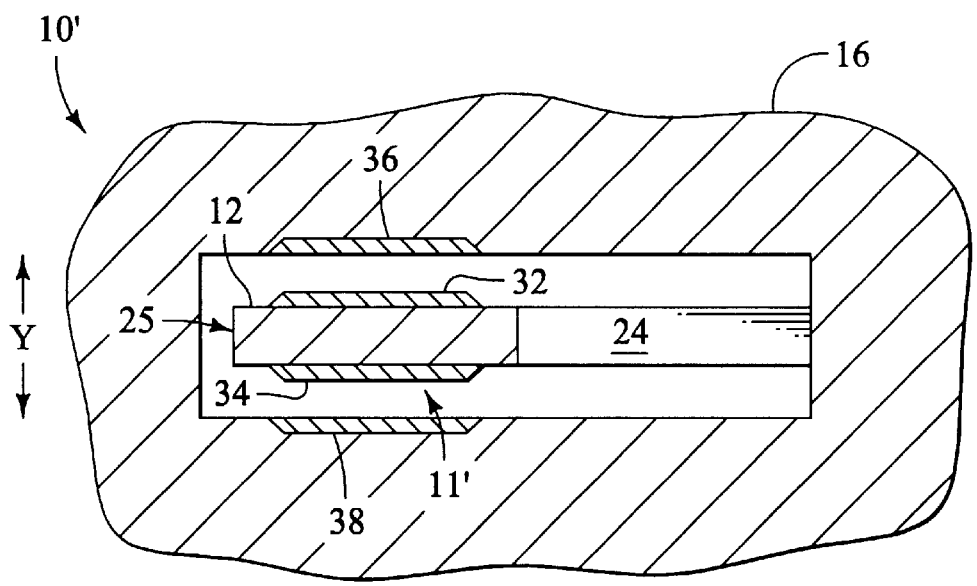
FIG. 4 depicts a side elevation sectional view of the MEMS device of FIG. 2.
Figure 5A:
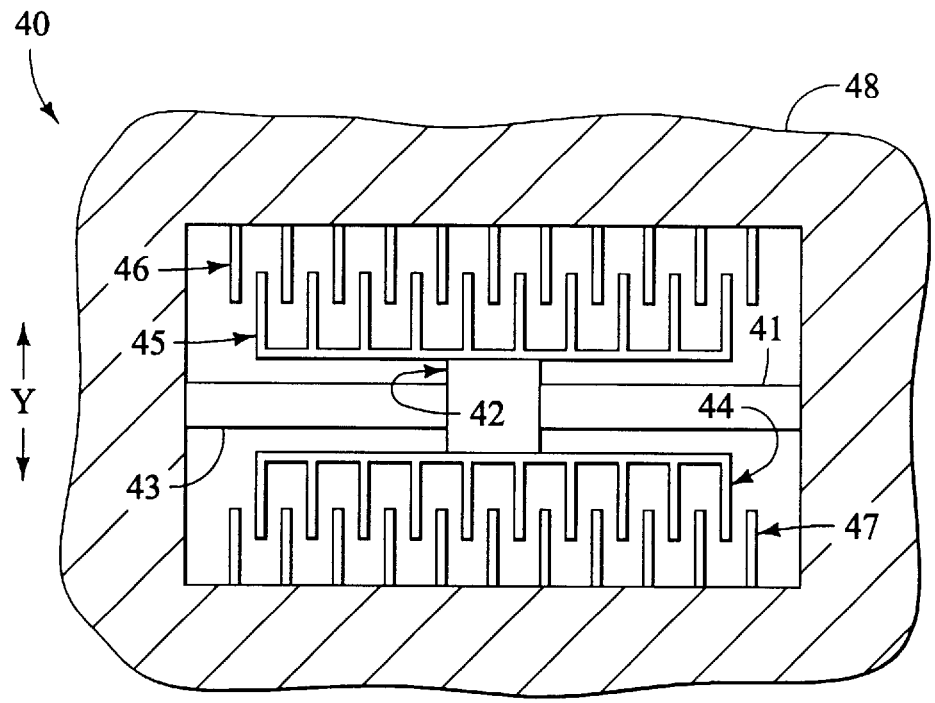
FIG. 5A depicts a side elevation sectional view of another MEMS device showing a prior art bridge support for the device.
Figure 5B:
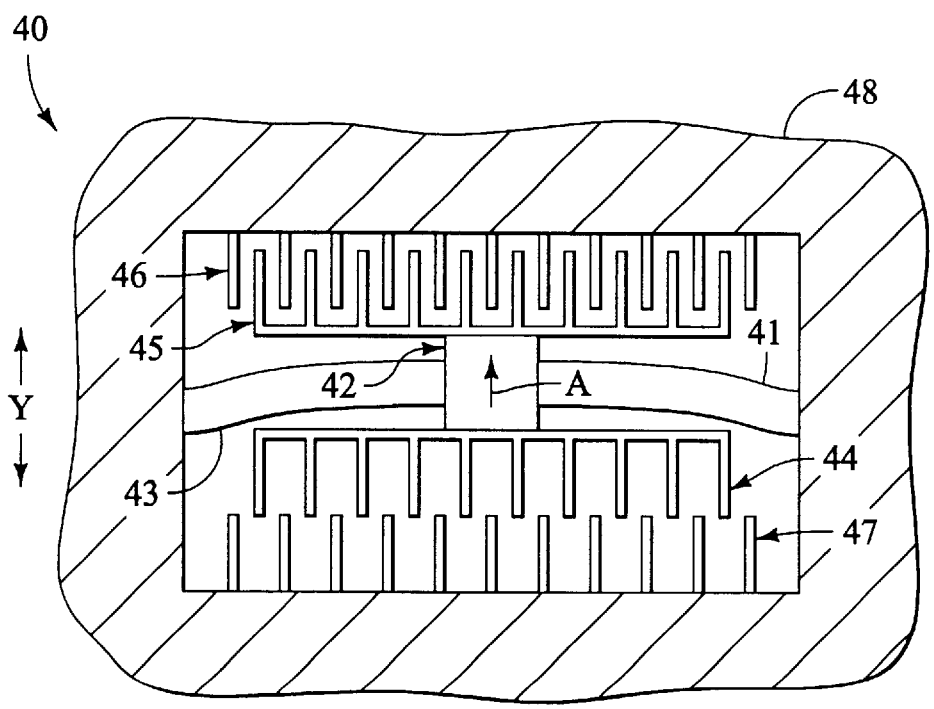
FIG. 5B depicts the MEMS device shown in FIG. 5A in an actuated position.

The present invention provides for a microelectromechanical device ("MEMD"), which has a mass element, which is supported by at least one support beam. The support beam used in the MEMD of the present invention differs from prior art support beams in that it includes a cross member (or a plurality of cross members) connecting two beam members which in combination support the mass element free from the surrounding substrate. This configuration provides a support beam in an MEMD which has good flexibility, low mass as compared to prior art support beams, and greater resistance to torsional bending than prior art support beams. These benefits can result in more accurate movement of the mass element, less power required to actuate the MEMD, and reduced failure of the device.

The present invention is directed to microelectromechanical devices. By this expression I mean any device which is a component in a MEMS. The device can be a purely mechanical component, a purely electrical component, or a combination component. The common feature of the MEMD of the present invention is that the device comprises a mass element, which is supported free (typically) from a substrate by at least one support beam. The mass element defines an area of interest, which can be used to support additional components. Alternately, the mass element itself can be used as the active component in the MEMD. For example, the mass element can be fabricated from a semi-conducting material. Then, as the mass element is moved closer to (or farther away from) a semiconductive area within the substrate, an electrical property (such as capacitance) between the mass element and the semiconductive area will be changed. This change can be sensed (detected) and used to control a variable. For example, the mass element can be part of a thermal sensor, in which case the mass element moves in response to a change in temperature in the surrounding environment. This movement will result in a sensible change of an electrical property within the device. The sensed change in the electrical property can then be used as a control signal to adjust or control a variable, such as the rate of flow of coolant to the surrounding environment.

I will use the term "substrate" herein to mean those portions of the MEMS which are in proximity to the mass element and the support beam of the MEMD, including portions below, above and to the side of the device. It is understood that these substrate portions of the MEMS can include a plurality of layers formed using known photolithographic processes, as well as other processes used for defining one structure within another in a semiconductor device.

I will now describe specific examples of my invention with respect to the accompanying drawings. However, it should be understood that the figures represent merely examples, and that the present invention is intended to include all embodiments which fall within the scope of the present disclosure. Further, the following drawings are not to scale, but are drawn so as to facilitate understanding of the present invention.

Figure 6:
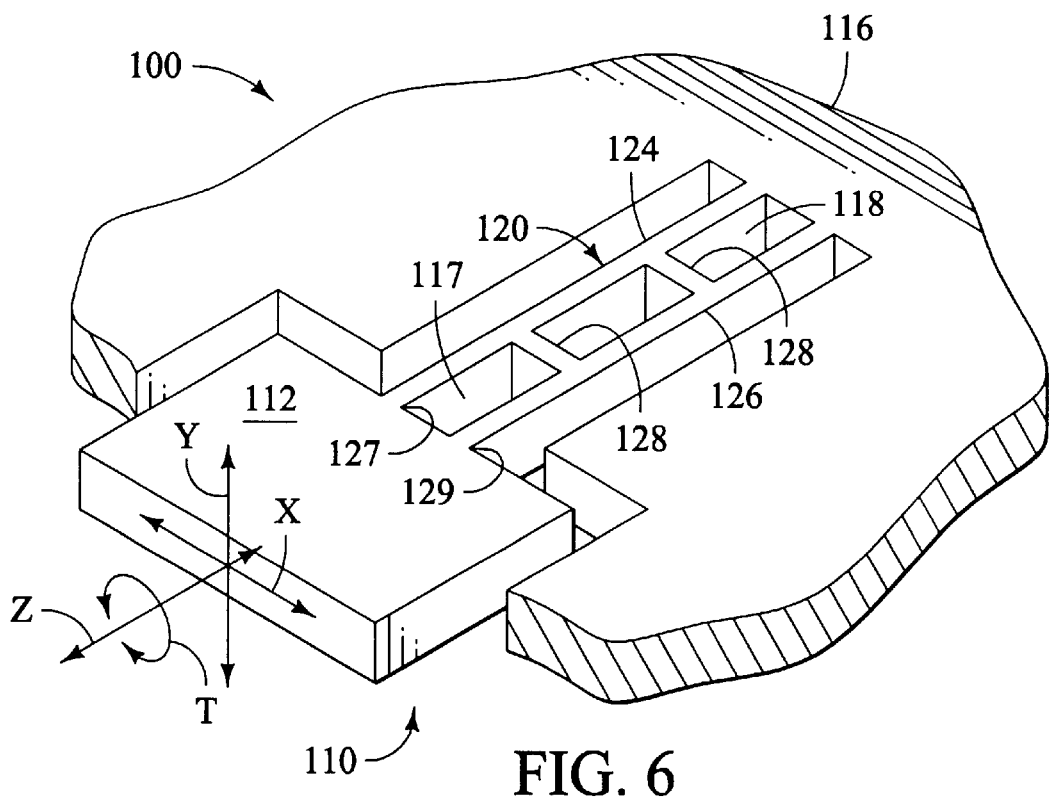
FIG. 6 depicts an isometric view of a MEMS device supported by a support beam in accordance with a first embodiment of the present invention.
Figure 7:
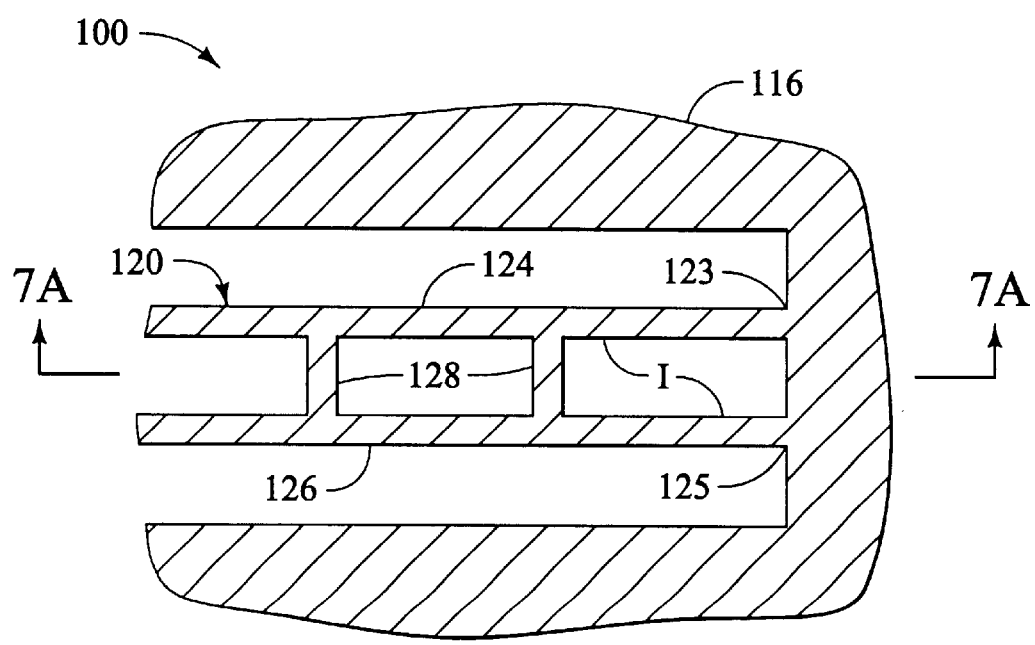
FIG. 7 depicts a plan view of a section of the support beam shown in FIG. 6.

Turning to FIG. 6, a section of a MEMS device is depicted in an isometric view showing a component 110 of a microelectromechanical device ("MEMD") in accordance with the present invention. The component 110 is defined within a substrate 116 and includes a mass element 112, which is supported within, and apart from, the surrounding substrate 116 by a support beam 120. In certain applications the mass element is not always out of contact with the surrounding substrate, but it is typically configured to move with respect to the surrounding substrate. Further, although the mass element is depicted as being rectangular in shape and wider than the support beam 120, there is no requirement that this be the case. For example, the mass element 112 could be as wide as, or narrower than, the support beam 120. FIG. 7 depicts a partial top view of the support beam 120 of FIG. 6. The support beam 120 includes a first beam member 124 defined by a first fixed end 123 which is connected to the substrate 116, and a first free end 127 (FIG. 6) connected to the mass element 112. The support beam 120 further includes a second beam member 126 defined by a second fixed end 125 (FIG. 7) which is connected to the substrate 116, and a second free end 129 (FIG. 6) connected to the mass element 112. By "free end" of the beam members 124 and 126 I do not mean that they freely terminate at this end, but only that the end is free to move in the "Y" direction. As can be seen in FIG. 6, the first beam member 124 is spaced apart from the second beam member 126. Although the beam members 124 and 126 are depicted as being essentially parallel to one another, there is no requirement that this be the case, and the beam members can converge towards their fixed ends 123 and 125 (FIG. 7), or towards their free ends 127 and 129 (FIG. 6). Further, while the beam members 124 and 126 are depicted as being straight, they can also be curved. For example, the beam members 124 and 126 can curve away from one another towards their centers.

Figure 7A:
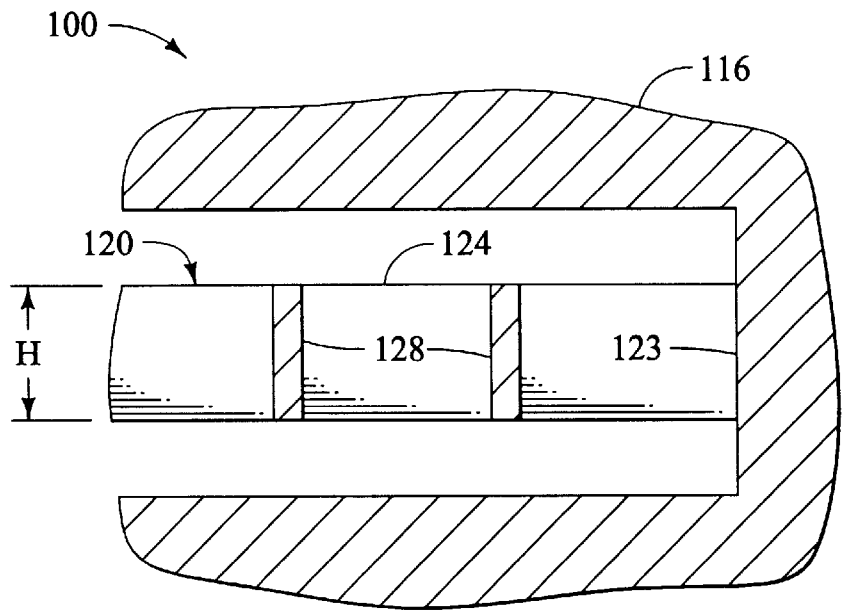
FIG. 7A depicts a side elevation sectional view of the support beam shown in FIG. 7.
Figure 11:
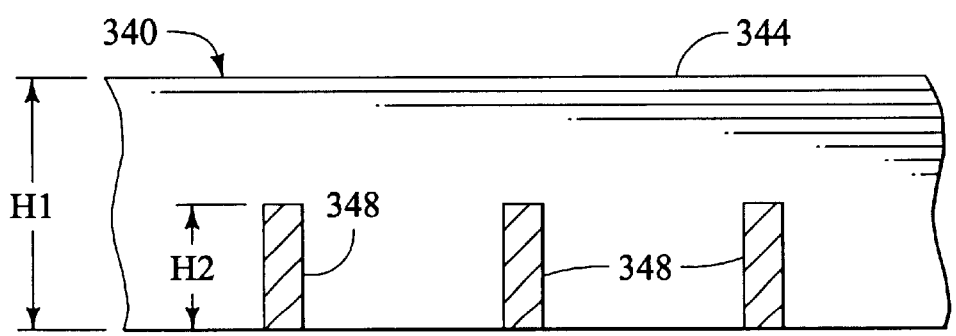
FIG. 11 depicts a side elevation sectional view of a portion of a MEMS device support beam, and shows a variation on the support beam depicted in FIG. 7A, in accordance with the present invention.

The support beam 120 of FIGS. 6 and 7 further includes a first cross member 128 which connects the first beam member 124 and the second beam member 126. Preferably, the support beam 120 includes a plurality of cross members 128. As can be seen in FIG. 7, the cross members 128 are connected to the inside surfaces "I" of the support members 124 and 126. FIG. 7A depicts a cross section of the portion of the support beam 120 depicted in FIG. 7. In this example the cross members 128 span the beam members (of which only beam member 124 is visible in FIG. 7A) over the entire height "H" of the beam member 124. However, this is not a requirement. For example, turning briefly to FIG. 11, a side elevation sectional view of a support beam 340 which can be used in a MEMD in accordance with the present invention is depicted, which is similar to the view depicted in FIG. 7A of the support beam 120. However, in the support beam 340 of FIG. 11 the cross members 348 do not span the entire height H1 of the first beam member 344, but only span a portion H2 of the height. While the cross members 348 of FIG. 11 are depicted as being oriented towards the bottom of the first beam member 344, the cross members 348 can also be located toward the top of the beam member 344, or anywhere between the top and the bottom of the beam member 344.

Figure 14:
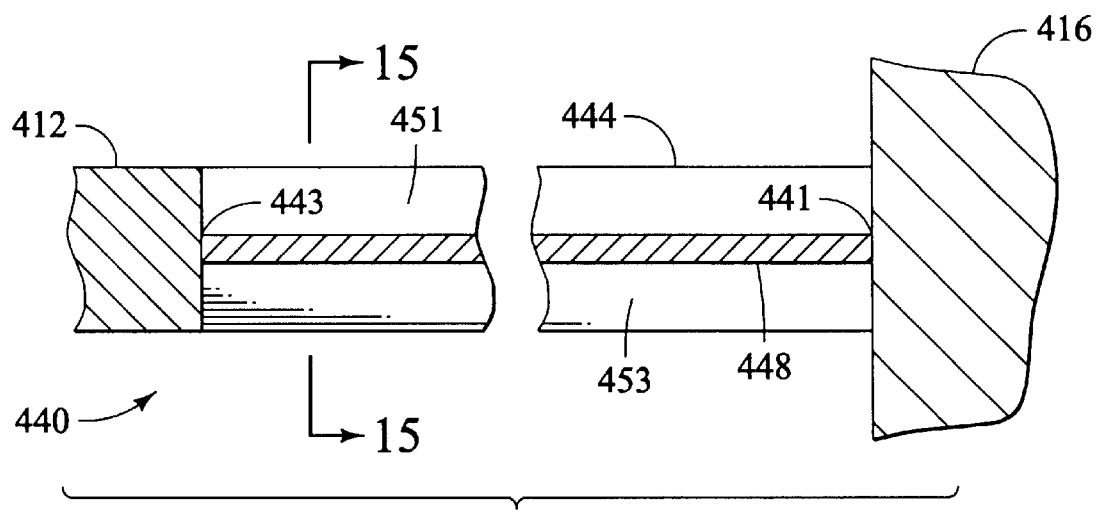
FIG. 14 depicts a side elevation sectional view of a section of a MEMS device support beam in accordance with a fourth embodiment of the present invention.
Figure 15:
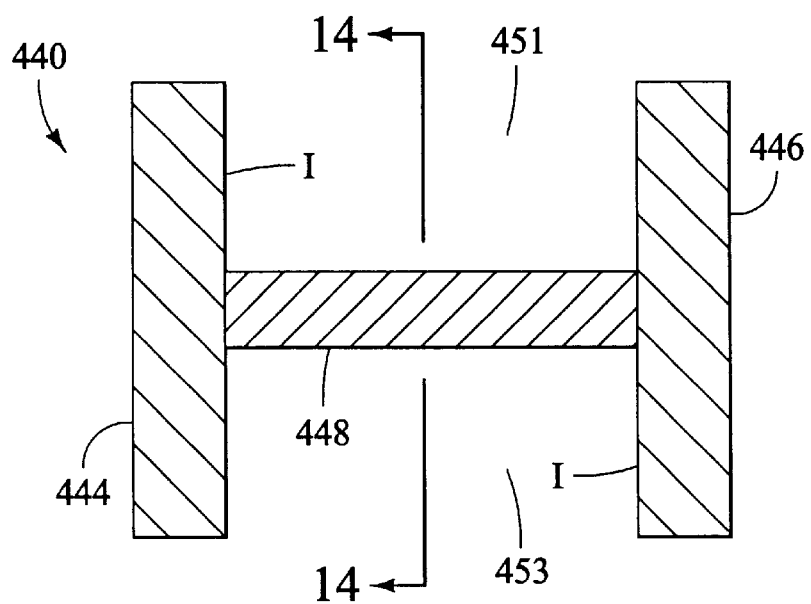
FIG. 15 depicts a front elevation sectional view of the support beam shown in FIG. 14.

Returning to FIG. 6, it can be seen that the first beam member 124, the second beam member 126, the first cross member 128 and the mass element 112 define a first void 117. Likewise, the first beam member 124, the second beam member 126, the second cross member 128 and the substrate 116 define a second void 118. This is also made clear by viewing FIGS. 7 and 7A. The definition of the voids 117 and 118 (FIG. 6) is a result of the cross members 128 being oriented essentially parallel to the "X-Y" plane defined in FIG. 6. However, the cross members 128 do not need to be oriented in the X-Y plane, but can be oriented otherwise. For example, in one variation depicted in FIGS. 14 and 15 the cross member is oriented in the X-Y plane (as defined in FIG. 6). With reference to FIG. 14, a side elevation sectional view of a support beam 440 which can be used in a MEMD in accordance with the present invention is depicted. The view in FIG. 14 is similar to the view depicted in FIG. 7A of the support beam 120. However, in the support beam 440 of FIG. 14 the cross member 448 spans from a first fixed end 441 at the substrate 416 to a second free end at the mass element 412. FIG. 15 depicts an end sectional view of the support beam of FIG. 14. As can be seen, the cross member 448 is connected to the first beam member 444 and a second beam member 446 at the inside surfaces "I" of each beam member. Thus, in this orientation the first beam member 444, the second beam member 446, the cross member 448, the mass element 412, and the substrate 416 define a first void 451 and a second void 453.

Figure 8:
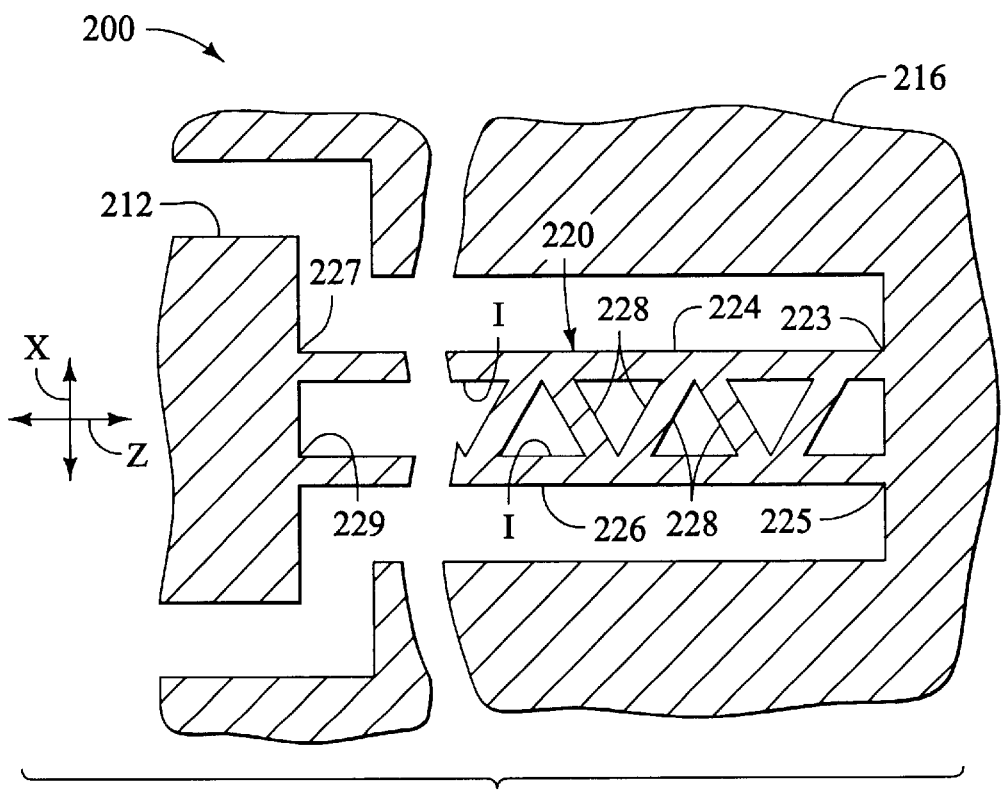
FIG. 8 depicts a plan view of a MEMS device supported by a support beam in accordance with a second embodiment of the present invention.

As shown in FIGS. 7 and 7A, the first beam member 124 and the second beam member 126 are substantially parallel, and the cross members 128 are substantially perpendicular to the beam members. However, the cross members do not need to be perpendicular to the beam members. For example, turning to FIG. 8 a component 200 of a MEMD in a MEMS in accordance with the present invention is depicted in plan view. The view depicted in FIG. 8 is similar to the view depicted in FIG. 7 for the MEMD component 100. The MEMD component 200 of FIG. 8 includes a mass element 212 which is supported in spaced-apart relationship from a substrate 216 by support beam 220. The support beam 220 includes a first beam member 224 defined by a first fixed end 223 which is connected to the substrate 216, and a first free end 227 connected to the mass element 212. The support beam 220 further includes a second beam member 226 defined by a second fixed end 225 which is connected to the substrate 216, and a second free end 229 connected to the mass element 212. The support beam 220 further includes cross members 228 which are connected to the beam members 224 and 226 and maintain the beam members in spaced-apart relationship from one another. However, whereas the cross members 128 of FIG. 7 are essentially perpendicular to the beam members 124 and 126, the cross members 228 of FIG. 8 are oriented at an angle to the beam members 224 and 226. Such a configuration can provide additional resistance to bending of the support beam 220 in the "X" direction, and additional resistance to torsional rotation about the "Z" axis.

Figure 9:
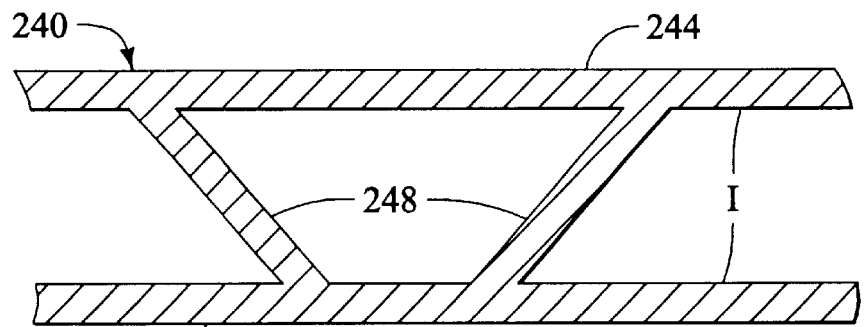
FIG. 9 depicts a plan view of a section of a MEMS device support beam, and shows a variation on the support beam depicted in FIG. 8, in accordance with the present invention.
Figure 10:
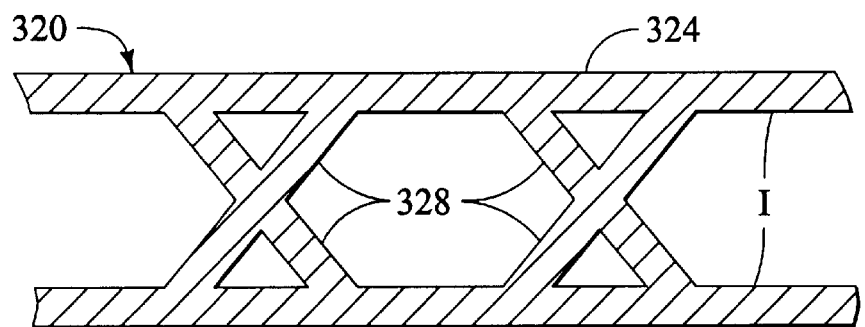
FIG. 10 depicts a plan view of a section of a MEMS device support beam, and shows a variation on the support beam depicted in FIGS. 8 and 9, in accordance with the present invention.

Although the cross members 228 of the support beam 220 of FIG. 8 are depicted as intersecting with one another at the inner surfaces "I" of the beam members 224 and 226, this is not a requirement. For example, turning to FIG. 9 a support beam 240 in accordance with the present invention is depicted in a partial plan view. The support beam 240 of FIG. 9 is similar to the support beam 220 of FIG. 8, except as follows. In FIG. 9, the cross members 248 are also oriented at an angle with respect to the inner surfaces "I" of the beam members 244 and 246, but the cross members 248 do not interest one another at their point of attachment to the beam members 244 and 246. Yet another variation is shown in FIG. 10 which depicts a partial plan view of a support beam 320 in accordance with the present invention, and which is similar to the support beam 240 of FIG. 9. However, in the support beam 320 of FIG. 10 the cross members 328, which are connected to first and second beam members 324 and 326, intersect one another at a point away from the inside surface "I" of the beam members.

All of the support beams of the present invention depicted in FIGS. 6, 8, 9, 10 and 14 can be formed from depositions (or even a single deposition) of a substance such as a polysilicon. The polysilicon substance can then be selectively removed using a process such as photolithography and etching to thus create the voids which define the beam members and the cross members. Alternately, a solid support beam (such as support beam 20 of FIG. 1) can first be formed by a single deposition of a material, and then parts of the solid beam can be removed using micromachining (e.g., by using an eximer laser) to form the support beams of the present invention. However, the cross members can also be formed using selective diffusions within material surrounding the beam members. This is demonstrated in FIGS. 12 and 13, which will now be described in detail.

Figure 12:
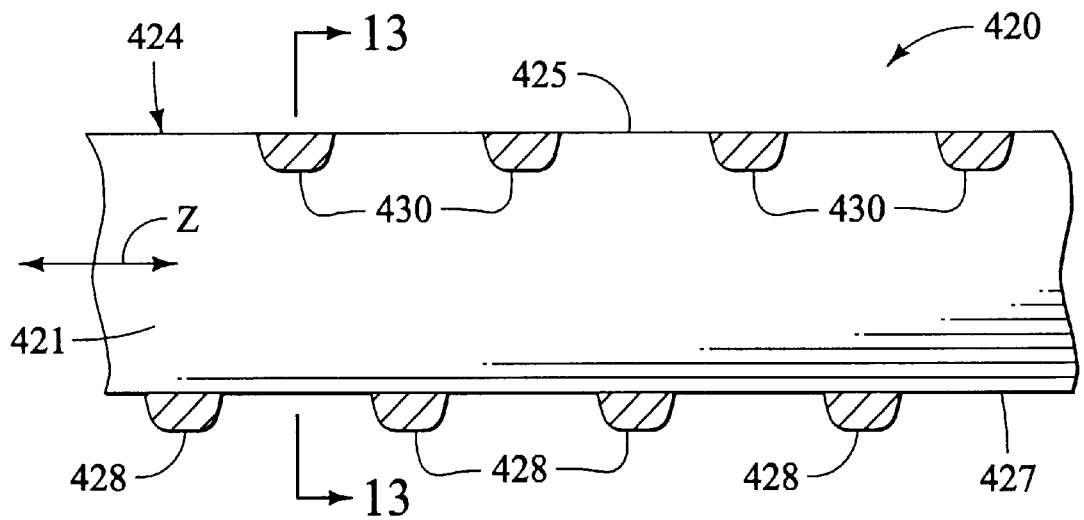
FIG. 12 depicts a side elevation sectional view of a section of a MEMS device support beam in accordance with a third embodiment of the present invention.

FIG. 12 depicts a partial side elevation sectional view of a support beam 420 of the present invention. The view depicted in FIG. 12 is similar to the view depicted in FIG. 7. The support beam 420 of FIG. 12 is shown in a sectional end view in FIG. 13. I will discuss these figures in tandem. The support beam 420 comprises a first beam member 424 and a second beam member 426 which are oriented in spaced-apart relationship, thus defining a void 421 between the inner surfaces "I" of the beam members. The beam members 424 and 426 are connected to one another at their upper edges 425 by upper cross members 430. Likewise, the beam members 424 and 426 are connected to one another at their lower edges 427 by lower cross members 428. As is seen in FIG. 12, the cross members 428 and 430 are relatively small in cross section as compared to the cross members in the previous examples (for example, the cross members 128 depicted in FIG. 7). The small cross section of the beam members 428 and 430 allows for a reduced mass of the overall support beam 420. Further, the positioning of the cross members 428 and 430 at the respective outside edges 427 and 425 provide for improved resistance to torsional rotation of the support beam 420 about the "Z" axis.

Figure 13:
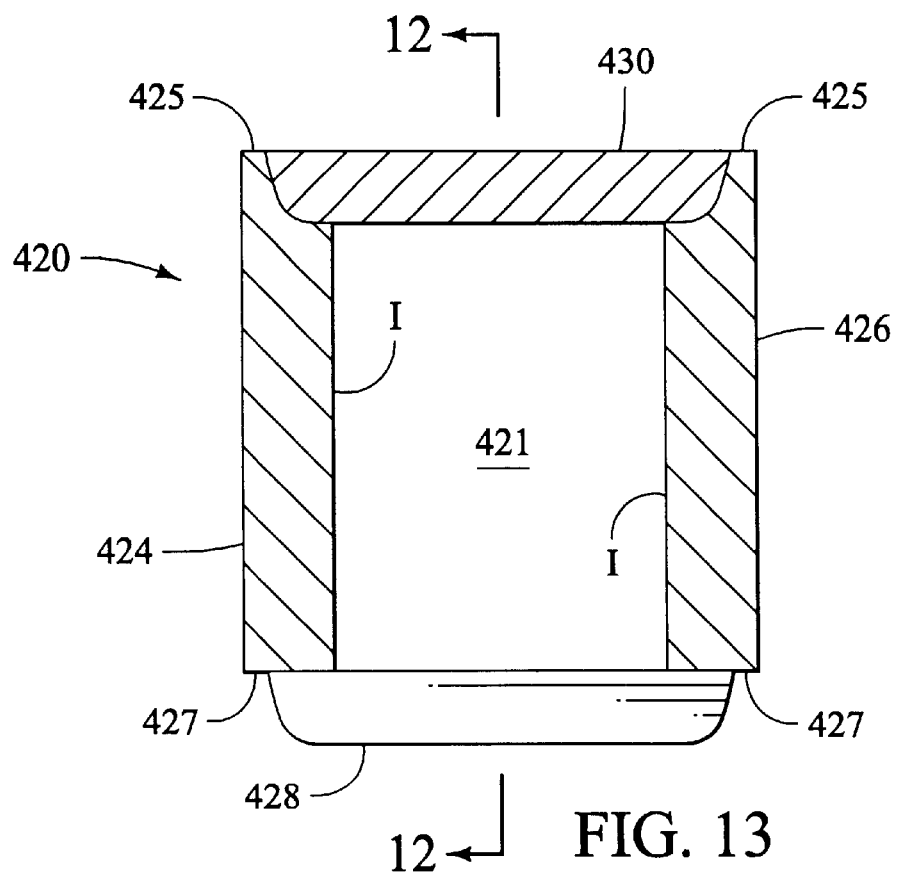
FIG. 13 depicts a front elevation sectional view of the support beam shown in FIG. 12.

The support beam 420 of FIGS. 12 and 13 can be formed as follows. A first oxide layer can be deposited. A first boron diffusion can be placed into the first oxide layer, the first boron diffusion defining the lower cross members 428. Then a second layer of oxide can be formed over the first layer of the oxide. The second layer of oxide defines the void area 421. Then polysilicon can be placed adjacent the second oxide layer to form the first beam member 424 and the second beam member 426. The polysilicon can be bonded to the first boron diffusion such that the lower cross members 428 are connected to the beam members 424 and 426 at the lower edges 427 of the beam members. A second first boron diffusion can then be placed into the upper surface of the second first oxide layer, as well as the upper edges of the beam members 424 and 426. The second boron diffusion defines the upper cross members 430. The first and second oxide layers can then etched away (preferably using concentration dependent etching), leaving behind the beam members 424 and 426, and the cross members 428 and 430.

Figure 16:
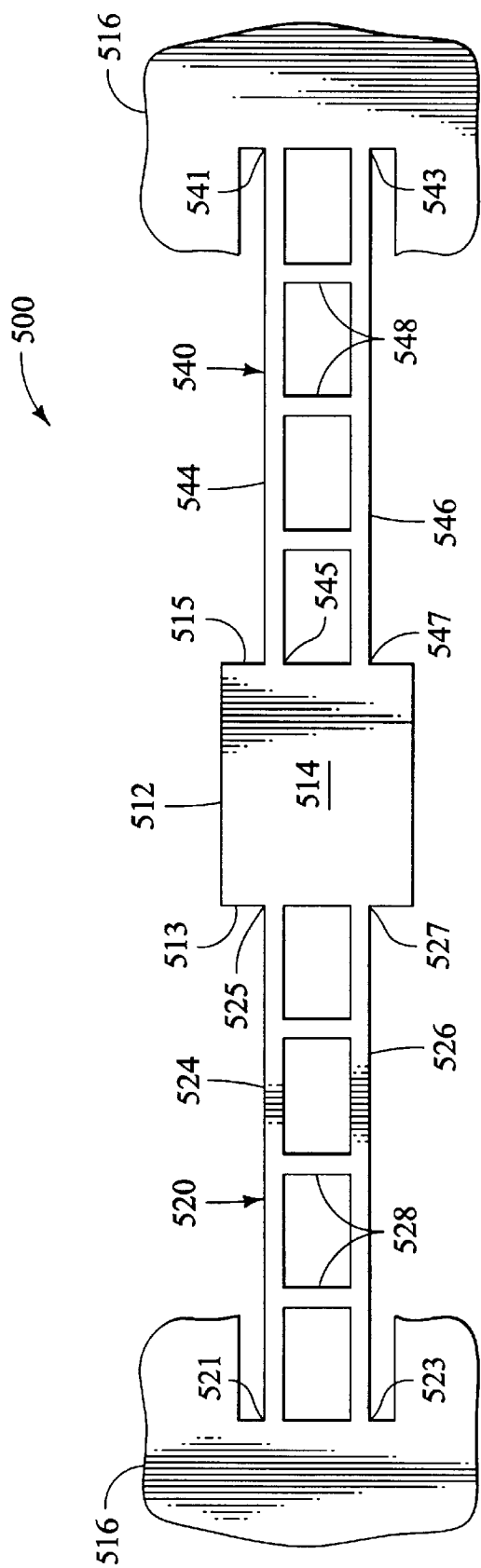
FIG. 16 depicts a plan view of a MEMS device configured in a bridge configuration supported by two support beams in accordance with the present invention.

Although all of the examples thus far have only shown an MEMD which has a mass element which is supported in a cantilevered manner by a support beam, it should be understood that the present invention is equally applicable to an MEMD in which the mass element is supported by a bridge structure. One example of such an MEMD is depicted in FIG. 16. FIG. 16 depicts a plan view of an MEMD 500 in accordance with the present invention. The MEMD includes a mass element 512 defining an area of interest 514, the mass element being defined by a first side 513 and an opposite second side 515. The MEMD 500 further includes a bridge supporting the mass element 512 in spaced-apart relationship from the substrate 516. The bridge comprises a first support beam 520 and a second support beam 540. The first support beam 520 comprises a first beam member 524 defined by a first fixed end 521 connected to the substrate 516, and a first free end 525 connected to the mass element 516 at the first side 513. The first support beam 520 further comprises a second beam member 526 defined by a first fixed end 523 connected to the substrate 516, and a first free end 527 connected to the mass element 516 at the first side 513. Likewise, the second support beam 540 comprises a first beam member 544 defined by a first fixed end 541 connected to the substrate 516, and a first free end 545 connected to the mass element 516 at the second side 515. The second support beam 540 further comprises a second beam member 546 defined by a first fixed end 543 end connected to the substrate 516, and a first free end 547 connected to the mass element 516 at the second side 515. The first beam member and the second beam member in each of the support beams 520 and 540 are spaced apart from one another. The first support beam 520 also includes a first cross member (and preferably a plurality of cross members) 528 connecting the first beam member 524 and the second beam member 526. Likewise, the second support beam 540 also includes a second cross member (and preferably a plurality of cross members) 548 connecting the first beam member 544 and the second beam member 546.

Although the cross members 528 and 548 in FIG. 16 are depicted as being similar to the cross members 128 of FIG. 7, it is understood that any of the alternate cross member configurations described above with respect to FIGS. 8, 9, 10, 11, 12 and 14 can be employed in the MEMD 500 of FIG. 16.

The present invention also provides for a method of forming a 11 microelectromechanical device ("MEMD") comprising a mass element, similar to the mass element 112 and 512 of respective FIGS. 6 and 16. The method includes the step of depositing a substrate layer, such as substrate 116 or 516 of respective FIGS. 6 and 16. As described previously, the "substrate layer" can in fact comprise a plurality of different layers which can include structures below, above and to the side of the MEMD. The mass element is formed by removing at least a portion of the substrate layer. The resulting mass element defines an area of interest (such as 514 of FIG. 16) which is preferably free of contact with the substrate. A first beam member (such as 124 of FIG. 6) is formed by removing at least a portion of the substrate. The resulting first beam member is defined by a first fixed end connected to the substrate (such as fixed end 123 of FIG. 7), and a first free end connected to the mass element (such as free end 127 of FIG. 6). Likewise, a second beam member (such as 126 of FIG. 6) is formed by removing at least a portion of the substrate. The resulting second beam member is defined by a first fixed end connected to the substrate (such as fixed end 125 of FIG. 7), and a first free end connected to the mass element (such as free end 129 of FIG. 6). After the beam members are formed, they are in spaced-apart relationship from one another. The method further includes forming a first cross member (such as cross member 128 of FIG. 6) by removing at least a portion of the substrate. The first cross member connects the first beam member and the second beam member. Preferably, the method includes forming a plurality of cross members which connect the beam members.

It should be appreciated that the steps described above do not need to be performed sequentially in the order described. For example, the mass element, the beam members and the cross members can all be formed from the substrate at the same time by a single photolithography and etching process. Alternately, the components can be formed by a combination of photolithography and micromachining processes. Micromachining processes can include using a focused ion beam, such as an eximer laser, to remove part of the substrate to reveal the components such as the mass element, the beam members, and the cross members. Likewise, the substrate can be formed using a number of different depositional processes, certain of which can be performed after the mass element, the beam members and the cross members are formed. For example, the substrate can be deposited as plurality of layers, wherein at least one of the layers comprises a sacrificial oxide, and at least one of the layers comprises a polysilicon. In this case, the mass element, the first beam member, the second beam member, and the cross members can be formed from the polysilicon and the sacrificial oxide layer can be etched away to suspend the mass element free from the remainder of the substrate. Further, the mass element, the beam members, and the cross members can be themselves formed from a plurality of depositional layers. For example, when the MEMD is a temperature sensor, then the mass element and the support beam can be formed from two different substances to create a bimetallic strip.

While the above invention has been described in language more or less specific as to structural and methodical features, it is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A microelectromechanical device defined within a substrate of a MEMS, comprising:
    a mass element defining an area of interest;
    a support beam supporting the mass element in spaced-apart relationship from the substrate, the support beam comprising:
        a first beam member defined by a first fixed end connected to the substrate, and a first free end connected to the mass element;
        a second beam member defined by a second fixed end connected to the substrate, and a second free end connected to the mass element, the second beam member being spaced apart from the first beam member;
        a first cross member connecting the first beam member and the second beam member; and
        wherein the beam members are each defined by a height, and wherein the first cross member is connected to the beam members across only a portion of the entire height.

2. A method of forming a microelectromechanical device comprising a mass element, the method comprising:
    depositing a substrate layer;
    forming the mass element by removing at least a portion of the substrate layer, the resulting mass element defining an area of interest free of contact with the substrate;
    forming a first beam member by removing at least a portion of the substrate, the resulting first beam member defined by a first fixed end connected to the substrate, and a first free end connected to the mass element;
    forming a second beam member by removing at least a portion of the substrate, the resulting second beam member defined by a second fixed end connected to the substrate, and a second free end connected to the mass element, the second beam member being spaced apart from the first beam member;

forming a cross member by removing at least a portion of the substrate, the first cross member connecting the first beam member and the second beam member; and wherein the substrate is deposited as a plurality of layers, and wherein the first cross member comprises a boron diffusion in the substrate.

3. A microelectromechanical device defined within a substrate of a MEMS, comprising:

a mass element defining an area of interest;

a support beam supporting the mass element in spaced-apart relationship from the substrate, the support beam comprising:

a first beam member defined by a first fixed end connected to the substrate, and a first free end connected to the mass element;

a second beam member defined by a second fixed end connected to the substrate, and a second free end connected to the mass element, the second beam member being spaced apart from the first beam member;

wherein each of the beam members is defined by an upper edge and a lower edge;

a first cross member connecting the first beam member and the second beam member at the upper edge of the beam members, but not at the lower edge of the beam members; and a second cross member connecting the first beam member and the second beam member at the lower edge of the beam members, but not at the upper edge of the beam members.

4. The microelectromechanical device of claim 3, and wherein at least one of the first and second cross members are formed from a boron diffusion in an oxide layer.

5. The microelectromechanical device of claim 3, and further comprising a plurality of first cross members connecting the first beam member and the second beam member at the upper edge of the beam members, but not at the lower edge of the beam members.

6. The microelectromechanical device of claim 5, and further comprising plurality of second cross members connecting the first beam member and the second beam member at the lower edge of the beam members, but not at the upper edge of the beam members.

7. The microelectromechanical device of claim 3, and further comprising a plurality of second cross members connecting the first beam member and the second beam member at the lower edge of the beam members, but not at the upper edge of the beam members.

8. A microelectromechanical device defined within a substrate of a MEMS, comprising:

a mass element defining an area of interest;

a support beam supporting the mass element in spaced-apart relationship from the substrate, the support beam comprising:

a first beam member defined by a first fixed end connected to the substrate, and a first free end connected to the mass element;

a second beam member defined by a second fixed end connected to the substrate, and a second free end connected to the mass element, the second beam member being spaced apart from the first beam member;

wherein each of the beam members is defined by an upper edge and a lower edge; and a first cross member oriented proximate to only one of the upper edges or the lower edges of, and connecting, the first beam member and the second beam member.

* * * * *